(12) United States Patent
Shioyama et al.

(10) Patent No.: US 8,607,312 B2
(45) Date of Patent: Dec. 10, 2013

(54) SERVER, INFORMATION PROCESSING METHOD AND PROGRAM

(75) Inventors: Noriaki Shioyama, Hokkaido (JP); Yoshiaki Koshoji, Hokkaido (JP)

(73) Assignee: Tokyo Electron Limited, Tokyo (JP)

( * ) Notice: Subject to any disclaimer, the term of this patent is extended or adjusted under 35 U.S.C. 154(b) by 642 days.

(21) Appl. No.: 12/536,862

(22) Filed: Aug. 6, 2009

(65) Prior Publication Data

US 2009/0300727 A1  Dec. 3, 2009

Related U.S. Application Data

(63) Continuation of application No. PCT/JP2008/051965, filed on Feb. 6, 2008.

(30) Foreign Application Priority Data

Feb. 7, 2007 (JP) ................................. 2007-027629

(51) Int. Cl.
| | |
|---|---|
| *G06F 17/00* | (2006.01) |
| *G06F 7/04* | (2006.01) |
| *G06F 17/30* | (2006.01) |
| *G06F 15/16* | (2006.01) |
| *H04L 29/06* | (2006.01) |

(52) U.S. Cl.
USPC ...................................... 726/4; 726/1; 726/2

(58) Field of Classification Search
USPC ..................................................... 726/1, 2, 4
See application file for complete search history.

(56) References Cited

U.S. PATENT DOCUMENTS

| | | | | |
|---|---|---|---|---|
| 6,356,899 | B1 * | 3/2002 | Chakrabarti et al. | 707/737 |
| 7,809,601 | B2 * | 10/2010 | Shaya et al. | 705/7.31 |
| 8,024,770 | B2 * | 9/2011 | Fee et al. | 726/1 |
| 8,059,818 | B2 * | 11/2011 | Asokan et al. | 380/277 |
| 8,127,132 | B2 * | 2/2012 | Andersson et al. | 713/167 |
| 8,132,225 | B2 * | 3/2012 | Chand et al. | 726/1 |
| 2002/0064138 | A1 | 5/2002 | Saito et al. | |

FOREIGN PATENT DOCUMENTS

| | | | |
|---|---|---|---|
| JP | 07-297257 | A | 11/1995 |
| JP | 11-186365 | A | 7/1999 |
| JP | 11-345751 | A | 12/1999 |
| JP | 2002-025997 | A | 1/2002 |
| JP | 2002-027567 | A | 1/2002 |

(Continued)

OTHER PUBLICATIONS

Machine translation of Japan Patent Publication JP 2002-050555 Translated: 05:16:40 JST Dec. 17, 2011.*

(Continued)

*Primary Examiner* — Kambiz Zand
*Assistant Examiner* — Benjamin Kaplan
(74) *Attorney, Agent, or Firm* — Pearne & Gordon LLP

(57) ABSTRACT

A server having an authority information storage configured to store therein authority information on an operation authority, a determination request information receiver configured to receive determination request information that is transmitted from a client and requests a permission/rejection determination on execution of a desired operation in the server or a client, a permission/rejection determination unit configured to make a permission/rejection determination in response to the determination request information received by the determination request information receiver based on the authority information, and a determination result information transmitter configured to transmit determination result information on a determination result made by the permission/rejection determination unit to the client that transmitted the determination request information.

18 Claims, 9 Drawing Sheets

(56) References Cited

FOREIGN PATENT DOCUMENTS

| | | |
|---|---|---|
| JP | 2002-050555 A | 2/2002 |
| JP | 3543996 A | 7/2004 |
| JP | 2006-073845 A | 3/2006 |
| JP | 2006-099735 A | 4/2006 |
| KR | 10-0372955 B1 | 5/2003 |

OTHER PUBLICATIONS

Machine translation of Japan Patent Publication JP 11-186365 Translated: 05:22:27 JST Dec. 17, 2011.*
Korean Office action for 10-2009-7018429 dated Apr. 14, 2011.
International Search Report for PCT/JP2008/051965, dated May 20, 2008.

* cited by examiner

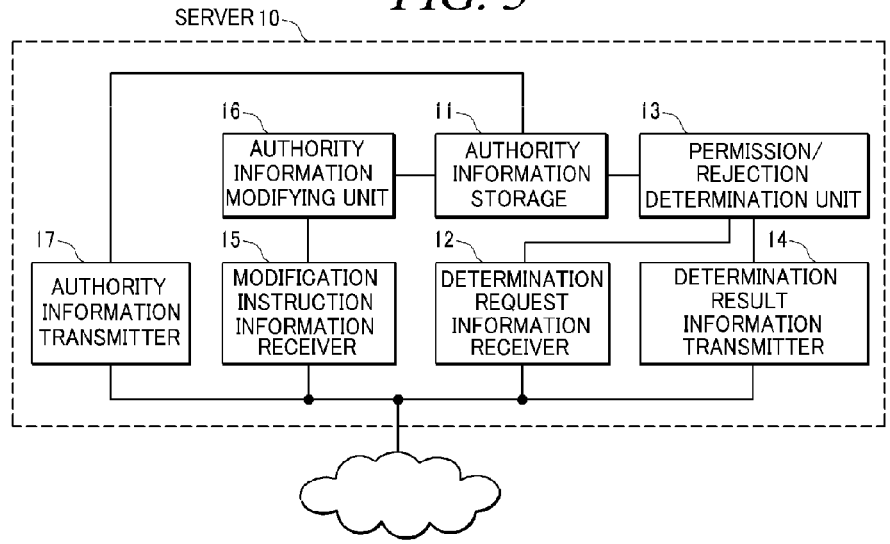
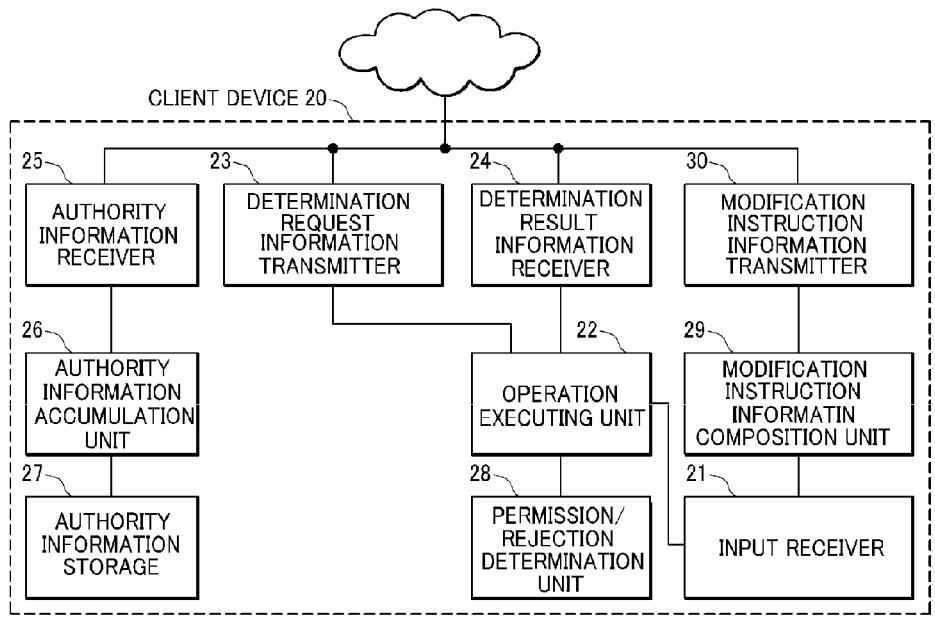

FIG. 7

|  |  | GROUP AUTHORITY | | |
|---|---|---|---|---|
|  |  | PERMITTED | NON-SETUP | REJECTED |
| USER AUTHORITY | PERMITTED | ○ | ○ | × |
|  | NON-SETUP | ○ | × | × |
|  | REJECTED | × | × | × |

○ : PERMISSION, × : NON-PERMISSION,

FIG. 9

AUTHORITY INFORMATION

| USER IDENTIFICATION INFORMATION | GROUP IDENTIFICATION INFORMATION | USER AUTHORITY INFORMATION |
|---|---|---|
| U001 | G001, G002 | A001;110, A002;100, A003;001, ------- |
| U002 | G001, G003 | A003;000, A006;110, ------- |
| U003 | G002, G003, G005 | A005;110, ------- |
| ⋮ | ⋮ | ⋮ |

FIG. 10

AUTHORITY INFORMATION

| GROUP IDENTIFICATION INFORMATION | GROUP AUTHORITY INFORMATION |
|---|---|
| G001 | A002;110, A003;001, ------- |
| G002 | A001;110, A002;000, ------- |
| G003 | A001;100, A005;100, ------- |
| ⋮ | ⋮ |

SERVER, INFORMATION PROCESSING METHOD AND PROGRAM

CROSS-REFERENCE TO RELATED APPLICATION

This is a continuation-in-part of International Application No. PCT/JP2008/051965.

This application claims the benefit of Japanese Patent Application No. 2007-027629, filed on Feb. 7, 2007, in the Japan Patent Office, the disclosure of which is incorporated herein in their entirety by reference.

BACKGROUND OF INVENTION

1. Field of the Invention

The present invention relates to a server that determines whether to give permission for operation execution in a server or a client.

2. Description of Related Art

Conventionally, when manipulating a semiconductor manufacturing apparatus, it is possible to restrict manipulation by a number of unspecified users and thus to prevent leakage of secrets through a user authentication process (see Patent Document 1). In addition, in the related art, there has been known a so-called batch type vertical heat treatment apparatus (see Patent Documents 2 and 3).

Patent Document 1: Japanese Patent Laid-open Publication No. 2002-27567

Patent Document 2: Japanese Patent Publication No. 3543996

Patent Document 3: Japanese Patent Laid-open Publication No. 2002-25997

Recently, a manufacturing apparatus such as a semiconductor manufacturing apparatus for performing a predetermined semiconductor process on a target substrate to be processed has been used while being connected with a communication line. Even in this circumstance, it is required, for security, to give permission for access to data or operation execution only to a user having a valid authority through a user authentication process. If the user authentication process is not performed, there is a risk that, for example, a user not having the valid authority may perform access to the data and therefore know-how can be leaked out. Further, if the user authentication process is not performed, there is a risk that the user not having the valid authority may modify parameters of a semiconductor manufacturing apparatus or the like and thus a problem may occur in the semiconductor manufacturing apparatus, which may cause serious damage.

However, it has been problematic that a great deal of efforts is needed to set up information on authority for each of a plurality of manufacturing apparatuses. Further, it has been problematic that in case of modifying the information on authority, it is needed to apply such a modification to each of the plurality of manufacturing apparatuses and such a modification consumes lots of time and efforts. Furthermore, it has been problematic that since the modification of the information on authority consumes lots of time, there is likelihood that an authentication process can not be performed properly due to a discrepancy between information on authority for one manufacturing apparatus and information on authority for another manufacturing apparatus.

BRIEF SUMMARY OF THE INVENTION

The present invention provides a server capable of readily manage information on authority and preventing a discrepancy between information on authorities for a plurality of manufacturing apparatuses.

According to one aspect of the present invention, a server has an authority information storage configured to store therein authority information on an operation authority, a determination request information receiver configured to receive determination request information that is transmitted from a client and requests a permission/rejection determination on execution of a desired operation in the server or a client, a permission/rejection determination unit configured to make a permission/rejection determination in response to the determination request information received by the determination request information receiver based on the authority information, and a determination result information transmitter configured to transmit determination result information on a determination result made by the permission/rejection determination unit to the client that transmitted the determination request information.

According to another aspect of the present invention, an information processing method, used in a server communicating with one or more client, includes receiving determination request information that is transmitted from a client and requests a permission/rejection determination on execution of a desired operation in the server or a client, making a permission/rejection determination in response to the determination request information received in a process of receiving the determination request information based on authority information on an operation authority, and transmitting determination result information indicative of the determination result made in a process of making the permission/rejection determination to the client that transmitted the determination request information.

BRIEF DESCRIPTION OF THE DRAWINGS

FIG. 3 is a bock diagram showing a configuration of a server in accordance with the embodiment;

FIG. 4 is a block diagram showing a configuration of a client device in accordance with the embodiment;

FIG. 7 is a view explaining a permission/rejection determination in accordance with the embodiment;

FIG. 9 is a view showing an example of authority information in accordance with the embodiment;

FIG. 10 is a view showing an example of authority information in accordance with the embodiment;

DETAILED DESCRIPTION OF THE INVENTION

Figure 1:
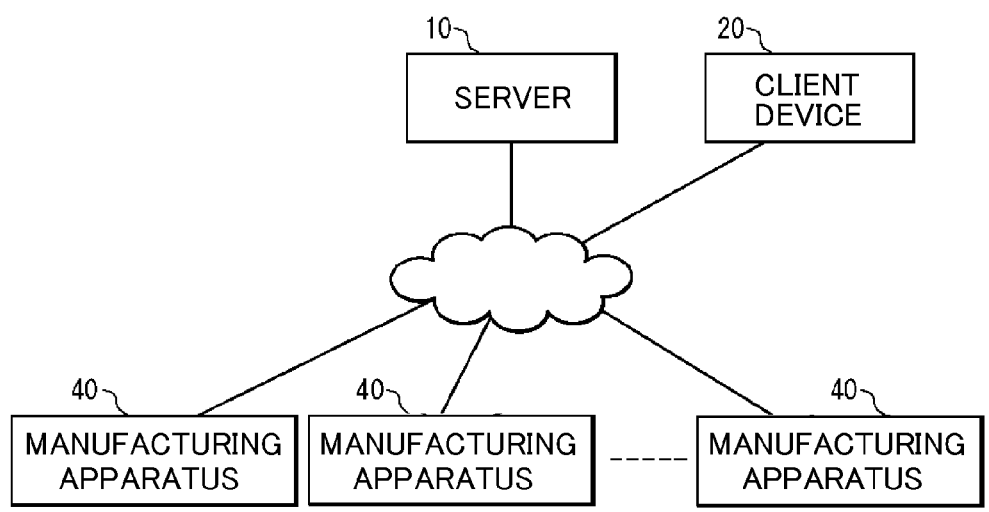
FIG. 1 is a block diagram illustrating a configuration of a group management system in accordance with an embodiment.

A group management system in accordance with an embodiment of the present invention will be explained with reference to accompanying drawings. In the explanation of embodiments below, components and steps assigned same reference numerals are operated in the same way, so that redundant description thereof may be omitted. FIG. 1 is a block diagram showing a configuration of a group management system in accordance with the present embodiment. The group management system includes a server 10 and clients, which are a client device 20 and N of manufacturing apparatuses 40. Here, N refers to an integer of 1 or 2 or more. In the group management system, the server 10, the client device 20 and the one or more manufacturing apparatuses 40 are communicatively connected to each other via a wired or wireless communication line. The communication line is Internet, intranet, public telephone networks or the like.

The server 10 stores authority information, and determines whether to give permission for operation execution based on such authority information. The details of the server 10 will be explained later. Further, the server 10 can store therein various kinds of measurement information generated from one or more manufacturing apparatuses 40. In addition, in response to a request of one of the clients 20 and 40, the server 10 performs an operation and may appropriately transmit a result of the operation to the client 20 or 40.

The manufacturing apparatus 40 is an apparatus for performing a predetermined semiconductor process on a target substrate. The manufacturing apparatus 40 is, e.g., a semiconductor manufacturing apparatus, a liquid crystal panel manufacturing apparatus, a plasma display panel manufacturing apparatus. The target substrate is a semiconductor wafer, a Flat Panel Display (FPD) substrate or the like. The FPD substrate is, e.g., a glass substrate. It should be noted that the predetermined semiconductor process performed by the manufacturing apparatus 40 on the target substrate may include its pretreatment or post-treatment, as long as it includes at least a process related to a semiconductor. The process performed by the manufacturing apparatus 40 on the target substrate is a film-forming process, an etching process, a thermal oxidation process or the like.

The client device 20 requests various kinds of operations to the server 10 or the manufacturing apparatus 40. Further, the client device 20 receives the operation results corresponding to the requests for the operations. In the present embodiment, the client device 20 has been explained as separated device. The client device 20, however, may be integrated to the manufacturing apparatus 40.

Figure 2:
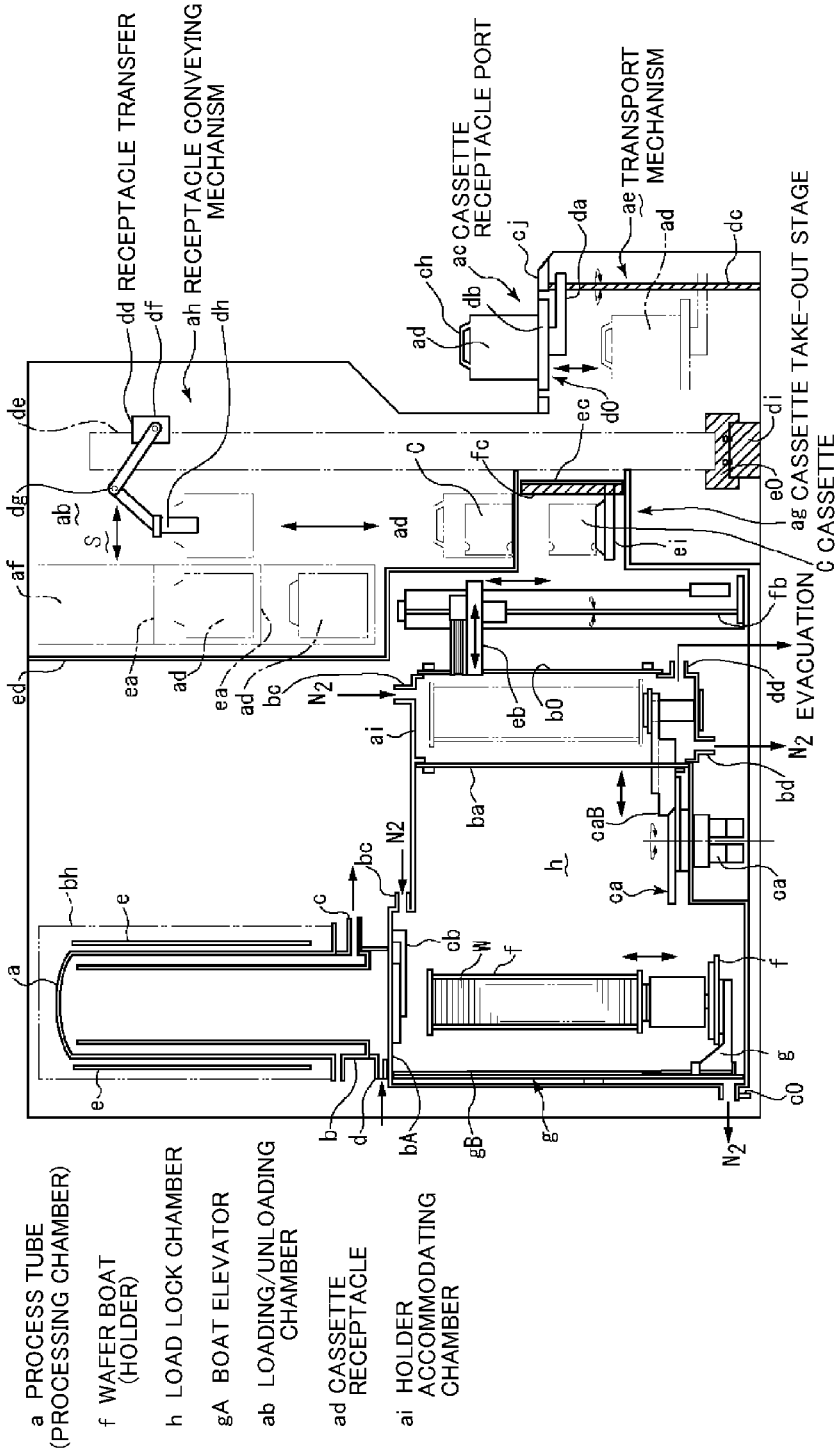
FIG. 2 is a view showing an example of a manufacturing apparatus in accordance with the embodiment.

The manufacturing apparatus 40 is, for example, a batch type vertical heat treatment apparatus, as illustrated in FIG. 2. The batch type vertical heat treatment apparatus also includes, as major components, a process tube a serving as a processing chamber for processing wafers W; a load lock chamber h to which $N_2$ gas is supplied as a nonreactive atmosphere and having a transfer mechanism g for loading or unloading a wafer boat f into or from the process tube a, wherein the wafer boat f serves as a holder for accommodating therein a number of, for example, 100, wafers W; a loading/unloading chamber ab for loading or unloading the wafer W into or from the load lock chamber h; a cassette receptacle port ac formed at the loading/unloading chamber ab; a transport mechanism ae for transporting a cassette receptacle ad mounted on the port ac into the loading/unloading chamber ab; a receptacle storage stage af for temporarily storing therein the transported cassette receptacle ad; a cassette take-out stage ag for taking out a cassette C accommodated in the cassette receptacle ad; a receptacle conveying mechanism ah for performing a conveyance of the cassette receptacle ad within the loading/unloading chamber ab; and a holder accommodating chamber ai disposed between the load lock chamber h and the loading/unloading chamber ab, for accommodating the wafer boat f therein. The detail of those components and others are described in Patent Document 2 and 3. Furthermore, the manufacturing apparatus 40 can be anything other than one shown in FIG. 2. In addition, for example, a recipe that is information related to a predetermined semiconductor process on a target substrate is stored in the manufacturing apparatus 40, and may be used for a process control.

Hereinafter, the configurations of the server 10, the client device 20 and the manufacturing apparatus 40 in accordance with the present embodiment will be explained with reference to the block diagrams shown in FIGS. 3 to 5. In the block diagrams in FIGS. 3 to 5, only featured parts in the group management system in accordance with the present embodiment are illustrated and other parts are omitted, but the server 10, the client device 20, and the manufacturing apparatus 40 may have configurations for performing a process related to a predetermined semiconductor process performed on a target substrate, such as a configuration for transferring the target substrate in the manufacturing apparatus 40, or a configuration for transmitting information on the temperature, pressure, or the like during a manufacturing process in the manufacturing apparatus 40 to the server 10.

FIG. 3 is a block diagram showing a configuration of the server 10 in accordance with the present embodiment. In FIG. 3, the server 10 in accordance with the present embodiment includes an authority information storage 11, a determination request information receiver 12, a permission/rejection determination unit 13, a determination result information transmitter 14. With this configuration, it becomes easy to manage authority information. Since the authority information is managed in a centralized manner in the server, in a case that a content of the authority information is required to be modified, for example, it is needed to modify only the authority information managed in the server. Therefore, convenience of a user who modifies the authority information is enhanced. Further, if the group management system includes two or more manufacturing apparatuses 40 and all the apparatuses are required to be accessed with the same authority, it is possible to prevent a discrepancy between information on authorities for a plurality of manufacturing apparatuses 40.

The server 10 may also include a modification instruction information receiver 15, an authority information modifying unit 16. With this configuration, it is possible to modify the authority information by transmitting or inputting modification instruction information to the server.

Further, the server 10 may include an authority information transmitter 17. With this configuration, the manufacturing apparatus or the client device 20 stores the authority information transmitted from the server, so that the manufacturing apparatus 40 and the client device 20 determines whether to give permission for operation execution based on the transmitted authority information even if it is impossible to communicate with the server 10.

The authority information storage 11 stores therein authority information. In the present embodiment, the authority information means information on authority for an operation. The authority information is indicative of whether the operation can be executed. The term "operation" implies various kinds of operations in the group management system and is, e.g., a manipulating operation of the server 10 or the manufacturing apparatus 40, an access operation to a recipe or the like used in the manufacturing apparatus 40, an access operation to a macro used in the group management system, an access operation to data collection conditions for collecting data of the manufacturing apparatus 40 by the server 10, an access operation to a parameter used in the manufacturing apparatus 40, a recovery operation in the manufacturing apparatus 40, an execution operation of a process in the manufacturing apparatus 40, an access operation to collection data collected in the manufacturing apparatus 40 and stored in the manufacturing apparatus 40 or the server 10, or an access operation to data statistically processed from the collection data. With this configuration, it is possible to manage authorities concerning execution of such operations. Here, the access operation is an operation for, e.g., reading or modifying information. Modifying information means, e.g., updating or deleting information. The recovery operation is an operation, e.g., for recovering a setup configuration of the manufacturing apparatus 40 to a setup configuration at a predetermined time point in the past. The collection data are trace data, event data, alarm data or the like, collected in the manufacturing apparatus 40. The trace data are temperatures, pressures or the like, collected in a sequence of time and can be expressed by a graph having a time axis. The event data include data collected at the time of each event during a semiconductor process in the manufacturing apparatus 40. The alarm data may be indicative of alarms generated in the past (e.g., a time and date or a place of an alarm, a kind of the alarm, information on an operation content in response to the alarm) or alarm setup (e.g., alarm conditions or information on an operation content in response to the alarm). The data statistically processed from the collection data include a result of the statistical analysis on the collection data and are indicative of, e.g., a maximum value or minimum value, a mean value, a value of 3σ, a variation gradient, or an integral value of the collection data. The data statistically processed from the collection data are stored in the server 10, the manufacturing apparatus 40 or other devices. The authority information may be, for example, information indicating whether reading of data is permitted, information indicating whether modification of data is permitted, information indicating whether execution of an operation is permitted.

The authority information may include correspondence information between user identification information for identifying a user and user authority information indicative of a user's authority for an operation. In this case, it is possible to manage an authority for each user who requests operation execution. Further, the authority information may include correspondence information between group identification information for identifying a group including a plurality of users and group authority information indicative of a group's authority for an operation. In this case, it is possible to manage an authority for each group which requests operation execution. Furthermore, the authority information may include correspondence information between the user identification information and the group identification information. Moreover, the authority information may include correspondence information between apparatus identification information for identifying an apparatus and apparatus authority information indicative of an authority of an apparatus for an operation. In this case, it is possible to manage an authority for each apparatus which requests operation execution. Further, the authority information may include correspondence information between apparatus group identification information for identifying a group including a plurality of apparatuses and apparatus group authority information indicative of an authority of an apparatus group for an operation. In this case, it is possible to manage an authority for each apparatus group which requests operation execution. Furthermore, the authority information may include correspondence information between the apparatus identification information and the apparatus group identification information. Moreover, the authority information may include information indicative of an authority other than the above-stated information.

The authority information storage 11 can be implemented by a storage medium (e.g., a semiconductor memory, a magnetic disc, or an optical disc). A process for storing authority information in the authority information storage 11 is not limited particularly. For example, it may be possible that the authority information is stored in the authority information storage 11 through a storage medium, the authority information transmitted through a communication line is stored in the authority information storage 11, or the authority information inputted through an input device is stored in the authority information storage 11. Further, the authority information stored in the authority information storage 11 is modified by the authority information modifying unit 16 to be described later.

The determination request information receiver 12 receives determination request information. Here, the determination request information is information for requesting a determination on whether to give permission for execution of a desired operation. Further, the determination request information may include the user identification information or operation identification information instead of a request (an instruction or an order), so that the server 10 may determine such information to be the determination request information. For example, the determination request information is indicative of a request for operation execution which includes the user identification information or the operation identification information and may be determined as the determination request information by the server 10. The determination request information may include the user identification information of the user who requests an operation or the apparatus identification information of the apparatus which requests an operation. In the present embodiment, the determination request information includes the user identification information of the user who requests an operation. Furthermore, the determination request information is transmitted from the client device 20 or the manufacturing apparatus 40. In the following explanation, the word "client" denotes the client device 20 or the manufacturing apparatus 40.

Moreover, the determination request information receiver 12 may include a receiving device (e.g., a modem, or a network card) for performing a reception. Further, the determination request information receiver 12 can be implemented by hardware or software such as a driver for driving the receiving device.

The permission/rejection determination unit 13 makes a permission/rejection determination in response to the determination request information received by the determination request information receiver 12. The permission/rejection determination unit 13 makes the permission/rejection determination based on the authority information stored in the authority information storage 11. In case that the determination request information includes the user identification information, the permission/rejection determination unit 13 may make the permission/rejection determination based on the user authority information in the authority information corresponding to the user identification information included in the determination request information. Further, in case that the determination request information includes the user identification information, the permission/rejection determination unit 13 may make the permission/rejection determination based on the group authority information in the authority information corresponding to the group identification information of the group including the user identified by the user identification information included in the determination request information. There will be described a detailed description of a method for making the permission/rejection determination later.

The determination result information transmitter 14 transmits a determination result to the apparatus which transmitted the determination request information. Here, the determination result information is indicative of a determination result made by the permission/rejection determination unit 13. The determination result information may be composed by units other than the determination result information transmitter 14 or by the determination result information transmitter 14. The determination result information may be transmitted to the apparatus which transmitted the determination request information directly, or through a predetermined server or the like. Furthermore, the determination result information transmitter 14 may include a transmitting device (e.g., a modem, or a network card) for performing a transmission. Further, the determination result information transmitter 14 can be implemented by hardware or software such as a driver for driving the transmitting device.

The modification instruction information receiver 15 receives modification instruction information. Here, the modification instruction information is information indicative of an instruction to modify the authority information. Modification of the authority information implies, for example, a modification of permission/rejection setup or a modification of a user group setup or an apparatus group setup. Further, the modification instruction information may include information indicative of a modification of a content of the authority information instead of an instruction or an order, so that the server 10 may determine such information to be the modification instruction information.

Receiving the information may be conducted by inputting it with the input device (such as a keyboard, a mouse, or a touch panel), transmitting it via a wired or wireless communication line from the client, or reading it from a storage medium (such as an optical disc, a magnetic disc, or a semiconductor memory). In the present embodiment, the modification instruction information receiver 15 receives the modification instruction information transmitted from the client. Further, the modification instruction information receiver 15 may include a device (e.g., a modem or a network card) for receiving information. Further, the modification instruction information receiver 15 can be implemented by hardware, software such as a device driver.

The authority information modifying unit 16 modifies the authority information stored in the authority information storage 11 in response to the modification instruction information received by the modification instruction information receiver 15. Through such a modification operation of the authority information, the authority information is modified according to the instruction of the modification instruction information. The authority information modifying unit 16 may add new information to the authority information, modify information included in the authority information, or delete the information included in the authority information.

The authority information transmitter 17 transmits the authority information stored in the authority information storage 11 to the client. There is no specific limitation on timing of transmitting the authority information by the authority information transmitter 17. For example, the authority information transmitter 17 may transmit the modified authority information at the time of modifying the authority information, may transmit the authority information periodically, or may transmit the authority information when the client can not communicate with the server 10, i.e., an off-line state. Furthermore, there is no specific limitation on a scope of the authority information transmitted by the authority information transmitter 17. For example, the authority information transmitter 17 may transmit all or part of the authority information stored in the authority information storage 11. In the latter case, the authority information transmitter 17 may transmit only the authority information related to a transmission destination such as the client. Moreover, the authority information can be transmitted to the client directly or through other server(s) or equipment(s).

Furthermore, the authority information transmitter 17 may include a transmitting device (e.g., a modem or a network card) for performing a transmission. Further, the authority information transmitter 17 can be implemented by hardware or software such as a device driver for the transmitting device.

Besides, any two or more units among the determination request information receiver 12, the determination result information transmitter 14, the modification instruction information receiver 15 and the authority information transmitter 17 may share a communication device, or have ones individually.

FIG. 4 is a block diagram showing a configuration of the client device 20 in the present embodiment. The client device 20 includes an input receiver 21, an operation executing unit 22, a determination request information transmitter 23, a determination result information receiver 24, an authority information receiver 25, an authority information accumulation unit 26, an authority information storage 27, a permission/rejection determination unit 28, a modification instruction information composition unit 29, and a modification instruction information transmitter 30. The manufacturing apparatus 40 can also include the similar units. Thus, the following explanation can be applied to both of the client device 20 and the manufacturing apparatus 40, which are called "client" collectively.

The input receiver 21 receives an input from a user manipulating the client, which is, e.g., inputted by the input device (a keyboard, a mouse, a touch panel or the like), or transmitted via a wired or wireless communication line. Moreover, the input receiver 21 may include a device (a modem, a network card or the like) for performing a reception. Further, the input receiver 21 can be implemented by hardware or software such as a device driver.

The operation executing unit 22 executes an operation requested by the user in response to instruction received by the input receiver 21, and also performs a control accompanied with the operation execution. Furthermore, if the client can communicate with the server 10 via the communication line, the operation executing unit 22 executes the operation when the determination result information for permitting the operation execution is received by the determination result information receiver 24, and if the client can not communicate with the server 10, the operation executing unit 22 executes the operation when the permission/rejection determination unit 28 makes a determination for permitting the operation execution. Furthermore, the operation executing unit 22 does not execute the operation requested by the user when the determination result information for rejecting the operation execution is received or when the permission/rejection determination unit 28 makes a determination for not permitting the operation execution.

The determination request information transmitter 23 transmits the determination request information for requesting the determination on whether to give permission for the operation execution to the server 10 before the operation executing unit 22 execute the operation. The determination request information may be composed by units other than the determination request information transmitter 23 or by determination request information transmitter 23. The determination request information may be transmitted to the server 10, e.g., directly or through a predetermined server. Furthermore, the determination request information transmitter 23 may include a transmitting device (a modem, a network card or the like) for performing a transmission. Further, determination request information transmitter 23 can be implemented by hardware or software such as a device driver for the transmitting device.

The determination result information receiver 24 receives the determination result information transmitted from the server 10. Further, the determination result information receiver 24 may include a receiving device (a modem, a network card or the like) for performing a reception. Further, the determination result information receiver 24 can be implemented by hardware or software such as a device driver for the receiving device.

The authority information receiver 25 receives authority information transmitted from the server 10. Further, the authority information receiver 25 may include a receiving device (a modem, a network card or the like) for performing a reception. Further, the authority information receiver 25 can be implemented by hardware or software such as a device driver for the receiving device.

The authority information accumulation unit 26 accumulates the authority information received by the authority information receiver 25 in the authority information storage 27. In the authority information storage 27, the authority information accumulated by the authority information accumulation unit 26 is stored. The authority information storage 27 can be implemented by a storage medium (a semiconductor memory, a magnetic disc, an optical disc or the like).

The permission/rejection determination unit 28 determines whether to give permission for operation execution to be executed by the operation executing unit 22. The permission/rejection determination unit 28 makes such a permission/rejection determination based on the authority information stored in the authority information storage 27. If the client can not communicate with the server 10 via the communication line as stated above, the permission/rejection determination unit 28 makes a rejection determination. A method of making the permission/rejection determination by the permission/rejection determination unit 28 is the same as a method performed by the permission/rejection determination unit 13 of the server 10 as stated above. The details thereof will be described later.

The modification instruction information composition unit 29 composes modification instruction information in response to an instruction received by the input receiver 21. The modification instruction information composition unit 29 composes the modification instruction information by, e.g., reading the modification instruction information pre-stored in the storage medium or newly generating modification instruction information in response to the inputted instruction.

The modification instruction information transmitter 30 transmits the modification instruction information composed by the modification instruction information composition unit 29 to the server 10. The modification instruction information is transmitted to the server 10 directly or through other server(s) or equipment(s). Further, the modification instruction information transmitter 30 may include a transmitting device (a modem, a network card or the like) for performing transmission. Furthermore, the modification instruction information transmitter 30 can be implemented by hardware or software such as a device driver for the transmitting device.

Besides, any two or more units among the determination request information transmitter 23, the determination result information receiver 24, the authority information receiver 25, and the modification instruction information transmitter 30 may share a communication device, or have ones individually.

Hereinafter, an operation of the group management system in accordance with the present embodiment will be explained with reference to a flow chart. In the following explanation, the word "client" denotes the client device 20 or the manufacturing apparatus 40. Therefore, a detailed explanation of operation occurred only in the manufacturing apparatus 40 will be omitted.

Figure 5:
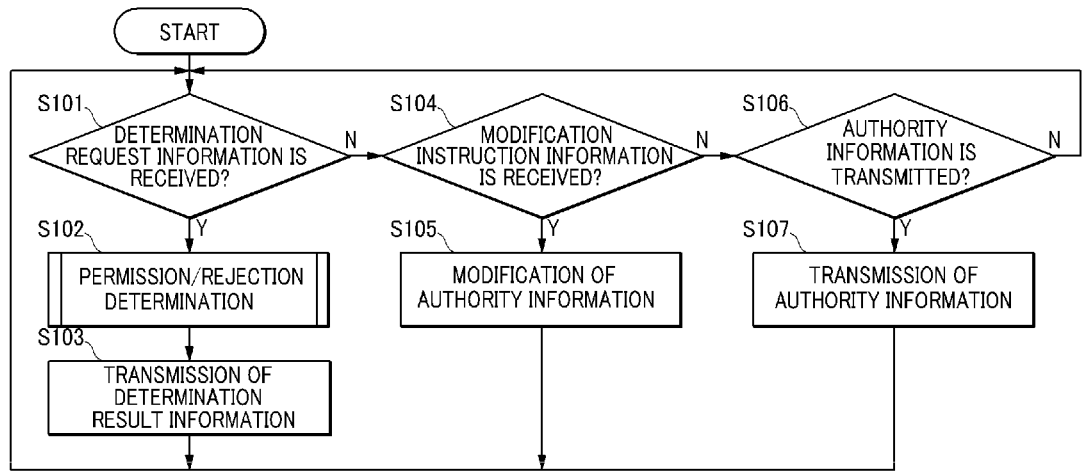
FIG. 5 is a flow chart showing an operation of the server in accordance with the embodiment.

FIG. 5 is a flow chart showing an operation of the server 10.
(Step S101) The determination request information receiver 12 determines whether determination request information is received. If the determination request information is received, a process proceeds to step S102; otherwise, the process proceeds to step S104.

(Step S102) The permission/rejection determination unit 13 makes a permission/rejection determination based on authority information in response to the determination request information received by the determination request information receiver 12. Further, the details of this determination process will be explained with reference to a flow chart of FIG. 6.

(Step S103) The determination result information transmitter 14 transmits determination result information on a result determination made by the permission/rejection determination unit 13 to a device which transmitted the determination request information. Then, the process returns to step S101.

(Step S104) The modification instruction information receiver 15 determines whether modification instruction information is received. If received, the process proceeds to step S105; otherwise, the process proceeds to step S106.

(Step S105) The authority information modifying unit 16 modifies authority information in response to the modification instruction information received by the modification instruction information receiver 15. Then, the process returns to step S101.

(Step S106) The authority information transmitter 17 determines whether it is timing for transmitting the authority information. If it is timing for transmitting the authority information, the process proceeds to Step S107; otherwise, the process returns to step S101.

(Step S107) The authority information transmitter 17 reads the authority information from the authority information storage 11 and transmits the authority information to the client. Then, the process returns to step S101. Further, in the flow chart of FIG. 5, the process is ended by an interrupt such as power-off or process ending.

Figure 6:
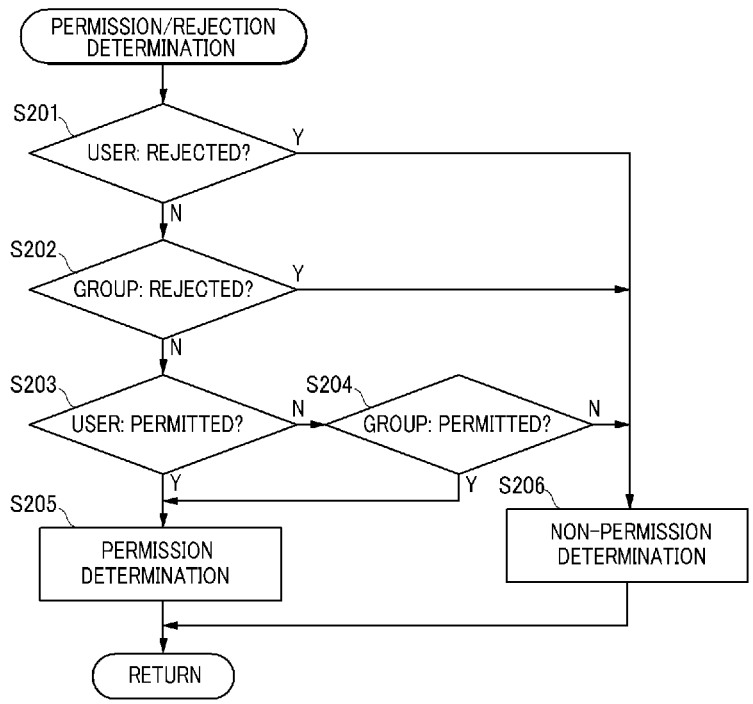
FIG. 6 is a flow chart showing an operation of the server in accordance with the embodiment.

FIG. 6 is a flow chart showing the details of the process of the permission/rejection determination (step S102) explained in the flow chart of FIG. 5. In the present embodiment, the determination request information includes user identification information, and the authority information includes user authority information and group authority information. Furthermore, the permission/rejection determination unit 13 makes a permission/rejection determination concerning the user identification information included in the determination request information based on the user authority information and the group authority information. On the determination step of the permission/rejection, it is determined as "permission" if at least one of the user authority information and the group authority information indicates permission and neither of them indicates rejection, as illustrated in FIG. 7. Meanwhile, on the determination step of permission/rejection, it is determined as "non-permission" if at least one of the user authority information and the group authority information indicates rejection or permission/rejection is not set in either of them, as illustrated in FIG. 7. By making the permission/rejection determination in such a way, a determination is made on the condition more strict for the user between a condition of the user authority information and a condition of the group authority information, so that it is possible to make the determination with a higher security level.

(Step S201) The permission/rejection determination unit 13 determines whether the user authority information corresponding to the user identification information included in the determination request information is "rejected." Then, a process proceeds to step S206 if rejected; otherwise, the process proceeds to step S202.

(Step S202) The permission/rejection determination unit 13 determines whether the group authority information corresponding to group identification information of a group including the user identified by the user identification information included in the determination request information is "rejected." Then, the process proceeds to step S206 if rejected; otherwise, the process proceeds to step S203.

(Step S203) The permission/rejection determination unit 13 determines whether the user authority information corresponding to the user identification information included in the determination request information is "permitted." Then, the process proceeds to step S205 if permitted; otherwise, the process proceeds to step S204.

(Step S204) The permission/rejection determination unit 13 determines whether the group authority information corresponding to the group identification information of the group including the user identified by the user identification information included in the determination request information is "permitted." Then, the process proceeds to step S205 if permitted; otherwise, the process proceeds to step S206.

(Step S205) The permission/rejection determination unit 13 determines that the execution of operation is permitted. Then, the process returns to the flow chart illustrated in FIG. 5. (Step S206) The permission/rejection determination unit 13 determines that the execution of operation is not permitted. Then, the process returns to the flow chart illustrated in FIG. 5.

The flow chart of FIG. 6 is an example, so any other than the flow chart of FIG. 6 is also available as long as the determination shown in FIG. 7 can be made. Moreover, the permission/rejection determination process can be performed according to any other than the flow chart of FIG. 6 even if either of the user authority information or the group authority information is not used, or even if other information included in the authority information is used.

Figure 8:
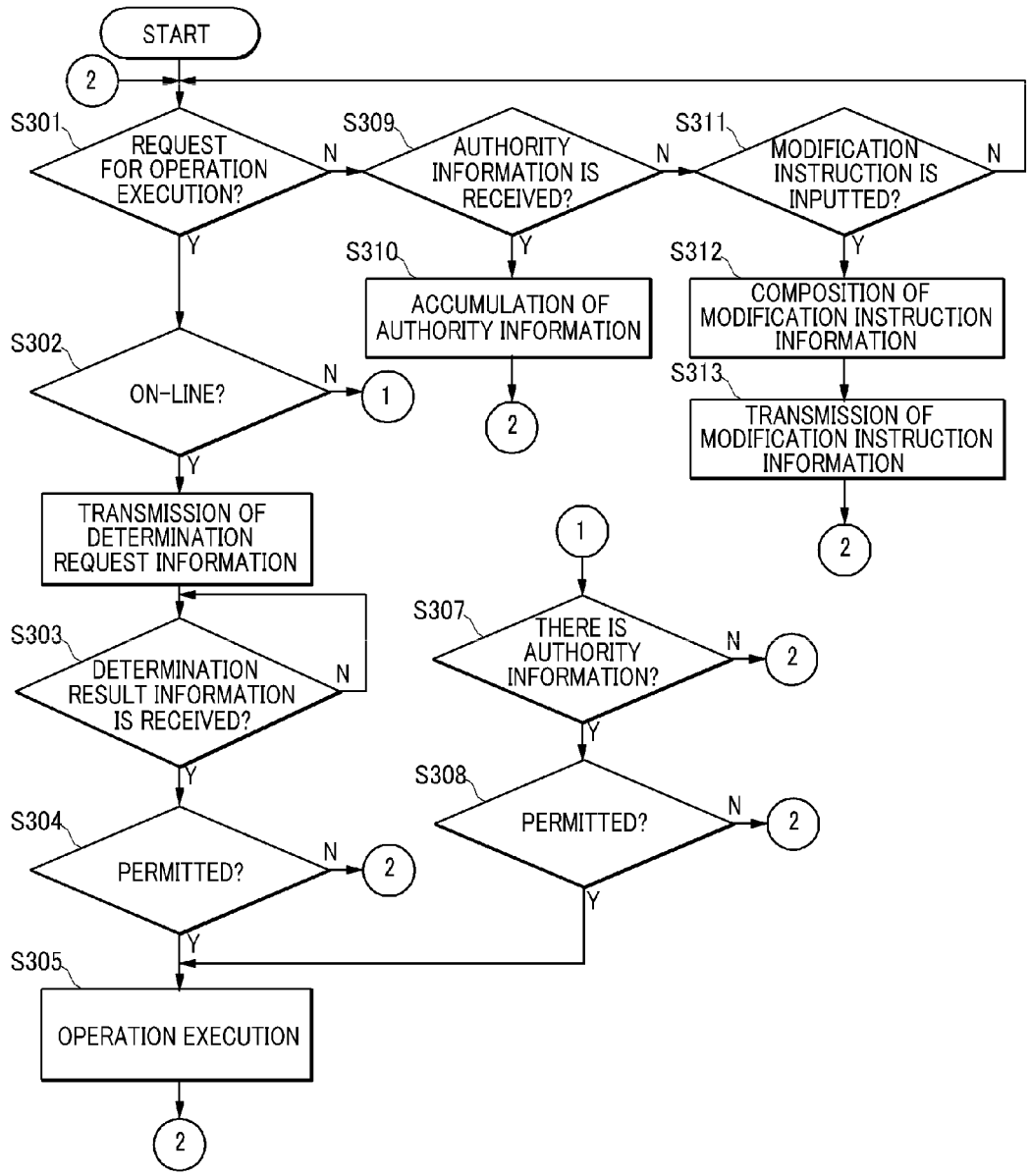
FIG. 8 is a flow chart showing an operation of the client in accordance with the embodiment.

FIG. 8 is a flow chart showing an operation of the client. (Step S301) The operation executing unit 22 determines whether input for requesting execution of a predetermined operation is received by the input receiver 21. Then, if received, a process proceeds to step S302; otherwise, the process proceeds to step S309.

(Step S302) The operation executing unit 22 determines whether the client is in an on-line state, i.e., the client can be communicated with the server 10. There is no specific limitation on a method of the determination. Therefore, the determination can be made by referring to, e.g., information on whether the client is in the on-line state if such information is stored in a memory, or by transmitting a packet for determining whether the client is in the on-line state. Then, if the client is in the on-line state, the process proceeds to step S303; otherwise, the process proceeds to step S307.

(Step S303) The determination request information transmitter 23 transmits determination request information to the server 10. The determination request information includes at least user identification information of a user who requests the execution of operation.

(Step S304) The determination result information receiver 24 determines whether determination result information is received. If received, the process proceeds to step S305; otherwise, the process of step S304 is repeated until received. If the determination result information is not received due to a certain error even after a certain time passes from when the determination request information was transmitted, it may be determined as timeout and the process may return to step S301.

(Step S305) The operation executing unit 22 determines whether the operation execution is permitted in the determination result information received by the determination result information receiver 24. Then, the process proceeds to step S306 if permitted; otherwise, the process returns to step S301.

(Step S306) The operation executing unit 22 executes the requested operation. This operation is an operation for, e.g., modifying a recipe of a predetermined manufacturing apparatus 40 as stated above. Therefore, the operation executing unit 22 may execute this operation by means of communicating with the manufacturing apparatus 40. Then, the process returns to step S301.

(Step S307) The permission/rejection determination unit 28 determines whether authority information is stored in the authority information storage 27. Then, the process proceeds to step S308 if stored; otherwise, the process returns to step 301.

(Step S308) The permission/rejection determination unit 28 determines whether execution of the requested operation is permitted based on the authority information stored in the authority information storage 27. Then, the process proceeds to step S306 if permitted, or the process returns to step S301 if not permitted.

(Step S309) The authority information receiver 25 determines whether the authority information is received. Then, the process proceeds to step S310 if received; otherwise, the process proceeds to step S311.

(Step S310) The authority information accumulation unit 26 accumulates the authority information received by the authority information receiver 25 in the authority information storage 27. Then, the process returns to step S301.

(Step S311) The input receiver 21 determines whether input indicative of an instruction to modify the authority information is received. Then, the process proceeds to step S312 if received; otherwise, the process proceeds to step S301.

(Step S312) The modification instruction information composition unit 29 composes modification instruction information in response to the input indicative of the instruction to modify the authority information received by the input receiver 21.

(Step S313) The modification instruction information transmitter 30 transmits the modification instruction information composed by the modification instruction information composition unit 29 to the server 10. Then, the process returns to step S301. In the present embodiment, the process can be ended by power-off or termination interrupt.

Hereinafter, an operation of the group management system in accordance with the present embodiment will be explained with a specific example. In this specific example, authority information shown in FIGS. 9 and 10 is stored in the authority information storage 11. In FIG. 9, user identification information, group identification information and user authority information correspond to each other. In a first record of FIG. 9, it is indicated that a user identified by user identification information "U001" belongs to a group identified by group identification information "G001" and "G002." Further, in FIG. 10, group identification information and group authority information correspond to each other. Here, there will be explained codes for the user authority information and the group authority information. A001 and the like mean information for identifying a target object. For example, A001 corresponds to a process parameter. Further, three digits separated from the information for identifying the target object by semicolon respectively indicate whether "reading (r)," "modification (w)" and "execution (e)" are permitted. "1" means permission, and "0" means rejection. For example, "A001; 110" implies that "reading" and "modification" of the process parameter are permitted and "execution" is rejected. Here, the process parameter does not have a concept "execution", so the permission/rejection of "execution" is meaningless as for the process parameter. For example, it can be seen that a user identified by user identification information "U002" in a second record of FIG. 9 is not permitted for anything with respect to a target object identified by "A003," and permitted for "reading" and "modification" with respect to a target object identified by "A006." Further, there is no setting of permission/rejection of a target object identified by "A002" with respect to a user identified by user identification information "U002."

In one embodiment of the present invention, the client is in an on-line state. Furthermore, the user identified by the user identification information "U001" uses the client. The user identification information is stored in a non illustrated memory of the client.

Figure 11:
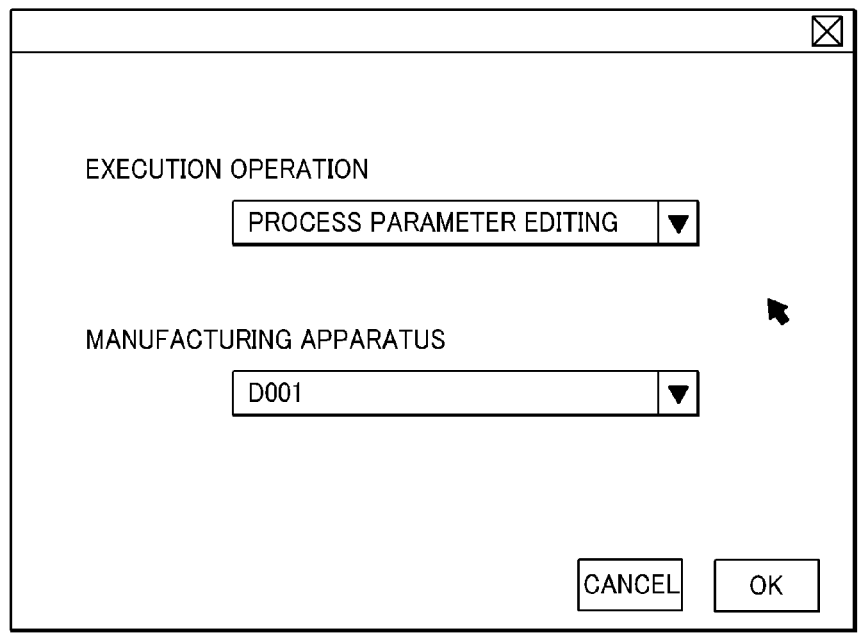
FIG. 11 is a view showing an example of a display in accordance with the embodiment.

The user operates the client device 20, and selects "process parameter editing" from a pull-down menu as an execution operation and selects the manufacturing apparatus 40 identified by apparatus identification information "D001" from a pull-down menu as the manufacturing apparatus 40 for performing such an execution operation, as illustrated in FIG. 11. Then, if the user clicks an "OK" button by manipulating a mouse, the operation executing unit 22 determines that a request for operation execution is received by the input receiver 21 (step S301) and determines that the client device 20 is in the on-line state by referring to a preset memory (step S302).

In order to transmit determination request information, the operation executing unit 22 reads the user identification information "U001" from a non-illustrated memory and then transmits: information "A001" for identifying a target object corresponding to "process parameter editing" which is an operation required to be executed; information "w" indicative of "editing(modification)" as an operation content; and an instruction for transmitting the determination request information to the determination request information transmitter 23. Consequently, the determination request information transmitter 23 composes a determination request information packet containing the user identification information "U001" and information "A001; w" indicative of the target object and the operation content, and then transmits the determination request information packet to a preset IP address of the server 10 as a transmission destination (step S303).

The determination request information packet transmitted from the client device 20 is received by the determination request information receiver 12 of the server 10 (step S101), and an IP address of a transmission source, i.e., an IP address of the client device 20, is obtained and transmitted to the determination result information transmitter 14. Further, the user identification information "U001" and the information "A001; w" indicative of the target object and the operation content contained in the determination request information are transmitted to the permission/rejection determination unit 13.

Upon receiving the user identification information and the information indicative of the target object and the operation content, the permission/rejection determination unit 13 determines whether to give permission by referring to the authority information stored in the authority information storage 11 as shown in FIGS. 9 and 10 (step S102). The information indicative of the target object and the operation content is "A001; w", so if a second digit on the left among the three digits separated from "A001" by semicolon in the authority information is "1", it means that the operation execution is permitted and if "0", it means that the operation execution is not permitted.

To be specific, the permission/rejection determination unit 13 determines whether to give a rejection of the operation execution by referring to the user authority information corresponding to the user identification information "U001", i.e., the user authority information shown in the first record of FIG. 9. In FIG. 9, information is set to be "A001; 110," so that the permission/rejection determination unit 13 determines that the operation execution is not rejected (step S201). Subsequently, the permission/rejection determination unit 13 obtains the group identification information "G001" and "G002" corresponding to the user identification information "U001" from the first record of FIG. 9, and then determines whether to give a rejection of the operation execution based on group authority information corresponding to the group identification information "G001" in FIG. 10. Since there is no setting of "A001" in the first record of FIG. 10, the permission/rejection determination unit 13 determines that the operation execution is not rejected. Further, the permission/rejection determination unit 13 determines whether to give a rejection of the operation execution based on group authority information corresponding to the group identification information "G002" in FIG. 10. In a second record of FIG. 10, since information is set to be "A001; 110," the permission/rejection determination unit 13 determines that the operation execution is not rejected (step S202).

Subsequently, the permission/rejection determination unit 13 determines whether to give permission for execution of the requested operation of "A001; w" by referring to the user authority information corresponding to the user identification information "U001." In FIG. 9, information is set to be "A001; 110," so that the permission/rejection determination unit 13 determines that the operation execution is permitted (step S203). Thereafter, finally, the permission/rejection determination unit 13 determines that the requested operation execution is permitted (step S205) and then transmits the determination result indicative of "permission" to a determination result information transmitter 14. Then, the determination result information transmitter 14 composes a determination result information packet containing the determination result indicative of "permission" and transmits the packet to the IP address of the client device 20, which was received from the determination request information receiver 12 in advance as a transmission destination (step S103).

The determination result information packet transmitted from the server 10 is received by the determination result information receiver 24 of the client device 20 (step S304) and transmitted to the operation executing unit 22. The operation executing unit 22 determines that the determination result information contains a purport of "permission" (step S305) and accesses the manufacturing apparatus 40 identified by the apparatus identification information "D001" to execute an operation for editing the process parameter (step S306). For example, this operation is executed by transmitting information for modifying the process parameter of the manufacturing apparatus 40 from the client device 20 to the manufacturing apparatus 40 in response to an instruction inputted by the client device 20 to modify the process parameter with reference to the process parameter of the manufacturing apparatus 40.

Furthermore, there will be briefly explained a case where the operation execution is not permitted. It is assumed that the determination request information transmitted from the client device 20 and received by the determination request information receiver 12 contains the user identification information "U001" and information "A002; r" indicative of a target object and an operation content. Therefore, if a first digit on the left among three digits separated from "A002" by semicolon in the authority information is "1," it means that the operation execution is permitted and if "0," it means that the operation execution is not permitted.

In this case, the permission/rejection determination unit 13 determines that the operation execution is not rejected by referring to the user authority information corresponding to the user identification information "U001," i.e., user authority information "A002; 100" shown in the first record of FIG. 9 (step S201). Subsequently, the permission/rejection determination unit 13 obtains the group identification information "G001" and "G002" corresponding to the user identification information "U001" from the first record of FIG. 9, and then determines that the operation execution is not rejected based on group authority information corresponding to the group identification information "G001" in FIG. 10 because information is set to be "A002; 110" in the first record of FIG. 10. Further, the permission/rejection determination unit 13 determines that the operation execution is rejected by referring to group authority information "A002; 000" corresponding to the group identification information "G002" in FIG. 10 (step S202). Finally, the permission/rejection determination unit 13 determines that execution of the requested operation is not permitted (step S206) and then transmits the determination result indicative of "non-permission" to the determination result information transmitter 14. Then, the determination result information transmitter 14 composes a determination result information packet containing the determination result indicative of "non-permission" and transmits it to the client device 20 (step S103).

Figure 12:
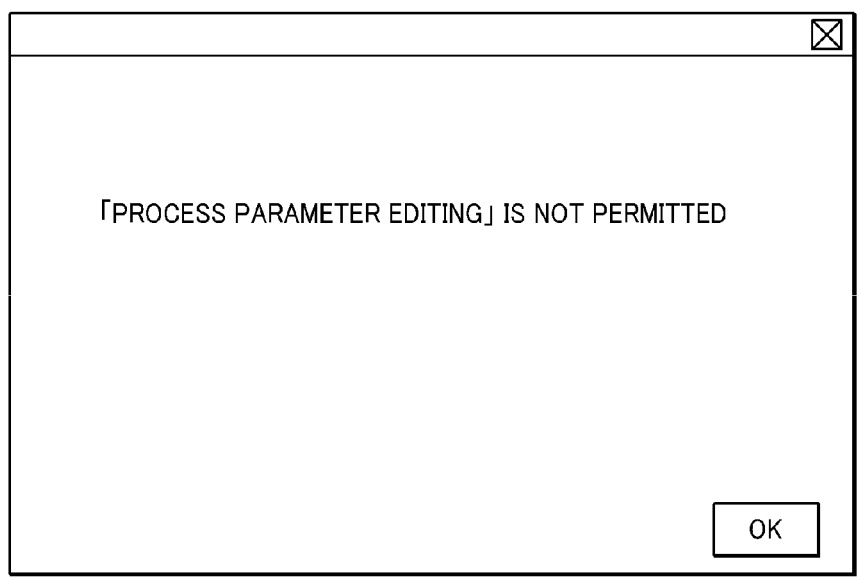
FIG. 12 is a view showing an example of a display in accordance with the embodiment.

The determination result information packet is received by the determination result information receiver 24 (step S304) and transmitted to the operation executing unit 22. The operation executing unit 22 determines that the determination result information contains a purport of "non-permission" (step S305) and shows a message on a display of the client device 20 as shown in FIG. 12 without executing the process parameter editing operation. The user can recognize that the process parameter editing operation is not permitted by reading the message. In this way, the user authorities can be managed collectively by the server 10.

Hereinafter, an operation for transmitting the authority information will be explained. In this case, assume that the time for transmitting the authority information is set to 2 a.m. every day. Upon sensing that it is 2 a.m. with reference to a non-illustrated clock (step S106), the authority information transmitter 17 reads the authority information from the authority information storage 11 as shown in FIGS. 9 and 10 and composes an authority information packet and then transmits it to a preset IP address of the client device 20 as a transmission destination (step S107). Herein, there is explained a case where the authority information is transmitted to only the client device 20, but it may be possible to transmit the authority information to the other devices.

The transmitted authority information packet is received by the authority information receiver 25 of the client device 20 (step S309) and accumulated in the authority information storage 27 by the authority information accumulation unit 26 (step S310).

In the above description, there has been explained a case where the client device 20 is in the online state and the determination request information is transmitted to the server 10 in order to make a permission/rejection determination, but even if the client device 20 is not in the on-line state, the permission/rejection determination is made by the permission/rejection determination unit 28 in the same manner as by the server 10 (step S307 and step S308).

Figure 13:
FIG. 13 is a view showing an example of a display in accordance with the embodiment.

Hereinafter, there will be explained an example of an operation for modifying authority information, in particular, an operation for setting up a group in the authority information. Above all, a user of a client device 20 displays a group setup on a screen by manipulating the client device 20. FIG. 13 illustrates an example of a displayed screen.

In FIG. 13, the user selects the group identification information "G001" and sets up user identification information of a user included in the selected group by manipulating a mouse or the like. For example, by clicking "add user" button, user identification information can be newly added. Further, by clicking and highlighting the user identification information, which is to be deleted, with a mouse or the like and then clicking "delete user" button, the user identification information can be deleted. Furthermore, by selecting an operation content for setting up the authority, a content of the authority can be set up. In FIG. 13, there is selected "process parameter" contained in "editing a constant value of a manufacturing apparatus" as a target object. Moreover, an operation authority for the target object is set up to be permitted for "reading" but not to be permitted for "modification." Besides, since the "execution" can not be applied to the process parameter, it is impossible to set up whether to give permission for "execution."

If the user clicks "OK" button in the display of FIG. 13, the input receiver 21 determines that modification instruction is inputted (step S311) and transmits information indicative of a modified content to the modification instruction information composition unit 29. Then, the modification instruction information composition unit 29 composes modification instruction information for registering group authority information and transmits it to the modification instruction information transmitter 30. The group authority information corresponds to the group identification information "G001" and the user identification information "U001," and indicates "A001; 100" which permits only read of the process parameter (step S312). The modification instruction information transmitter 30 transmits the modification instruction information to the server 10 (step S313).

The transmitted modification instruction information is received by the modification instruction information receiver 15 (step S104) and transmitted to the authority information modifying unit 16. The authority information modifying unit 16 modifies the authority information stored in the authority information storage 11 by referring to the modification instruction information (step S105). To be specific, if new user identification information is added to the group identification information "G001", the group identification information "G001" is registered to include the new user identification information. Further, "A001; 100" is added to the group authority information corresponding to the group identification information "G001."

In the description above, there has been explained a case where modification instruction information on a corresponding relationship between the group identification information and the user identification information and a corresponding relationship between the group identification information and the group authority information is transmitted and the authority information is modified according to such modification instruction information. However, it is possible to employ other modifications such as a modification of the authority information according to transmitted modification instruction information indicative of a modification on a corresponding relationship between the user identification information and the user authority information.

Moreover, in this detailed example, there has been explained a case where either of permission "1" or rejection "0" is set with respect to each operation of "reading," "modification" and "execution" in the authority information, but it may be possible to employ other cases such as a case where permission/rejection is not set. For example, it may be possible to set "2" in case that permission/rejection is not determined.

Besides, in this detailed example, there have been explained three kinds of operations, i.e., "reading," "modification" and "execution" as an operation with respect to the target object. However, it may be possible to perform the permission/rejection setup for other kinds of operations. Further, it may be also possible to make a permission/rejection setup for only one or two kinds of operations.

Furthermore, in this detailed example, there has been explained a case where the user group is set up, but it is appropriate that the group is set up according to attributes of the users because it is general that the authority is assigned according to attributes of the users. For example, an operator group may be set up for users who operate the manufacturing apparatus 40; a maintainer group may be set up for users who control the manufacturing apparatus 40; and a service group may be set up for service engineers of a seller of the manufacturing apparatus 40.

Moreover, in this detailed example, there has been explained a case where the operation is executed or not executed in the client device 20 according to the result of the permission/rejection determination. However, as for an operation which can not be executed according to the result of the permission/rejection determination, a button on an interface screen displayed on the display is shown not to be clicked or name of the operation is shown to be light colored, whereby the user can recognize easily that the operation is not permitted.

Further, in the detailed example, it may be possible that before the authority information is modified according to the modification instruction information, there is performed an authentication process for the user who inputs the modification instruction information and only the user who has authority for modifying the authority information is given permission to transmit the modification instruction information or to modify the authority information according to the modification instruction information.

As stated above, in the group management system in accordance with the present embodiment, the server 10 manages the authority information, thereby reducing efforts required for maintenance of the authority information in comparison with a case where each manufacturing apparatus 40 manages the authority information. Furthermore, even if there is a plurality of manufacturing apparatuses 40, it is possible to avoid a discrepancy between information on authorities for the manufacturing apparatuses 40.

Further, in case that the permission/rejection determination based on the authority information is made in n off-line state, it may be possible to set up, for example, a validity period for the authority information stored in the client device 20 and used for making the permission/rejection determination. Then, when the validity period is expired, the permission/rejection may be not determined based on the authority information in the offline state. It is because that if a long time passes after the authority information is set up, it may be deemed that the permission/rejection determination based on the authority information can not be made appropriately. An initial time point of the validity period may be, e.g., a time point of accumulating the authority information in the client device 20 or a time point of the latest update of the authority information in the server 10.

In addition, in the present embodiment, the authority information has not been provided for each manufacturing apparatus 40. Instead, there has been explained a case where the plurality of manufacturing apparatuses 40 is set up to have the same authority information. However, it may be also possible that each manufacturing apparatus 40 is set up to have different authority information. In this case, the user authority information is set up for each manufacturing apparatus 40 such that, for example, apparatus identification information for identifying the manufacturing apparatus 40, the user identification information and the user authority information correspond to each other in the authority information.

Besides, if the permission/rejection determination unit 13 makes a permission determination, the determination result information may include key information on a key enabling the operation execution. By using the key information, the client device 20 or the like can execute a desired operation. Therefore, the manufacturing apparatus 40 determines whether the key information transmitted together with the operation request is valid, and if valid, the manufacturing apparatus 40 may allow the operation to be executed. By this way, even if an illegal user modifies the program of the client device 20 to execute a required operation though the determination result information indicative of permission is not received from the server 10, the required operation can not be executed without the key information. Therefore, an illegal operation such as execution of the required operation without permission can be prevented.

Furthermore, as stated above, in the present embodiment, there has been explained a case where the client device 20 performs transmission of the determination request information and the like. However, the manufacturing apparatus 40 may perform the same operation as the client device 20 explained in the present embodiment. In this case, the manufacturing apparatus 40 may request the server 10 to determine whether to give permission for execution of an operation related to itself or may request the server to determine whether to give permission for execution of an operation related to another manufacturing apparatus 40.

Moreover, the server 10 in the group management system in accordance with the present embodiment may perform only an authority management and permission/rejection determination as illustrated in the configuration of FIG. 3. Therefore, another server may be provided in order to perform other operations of the group management system such as operation execution in response to a request from the client and transmission of a result of the operation to the client, or accumulation of various kinds of measurement information transmitted from one or more manufacturing apparatuses 40.

Further, the server 10, the client device 20 and the manufacturing apparatus 40 of the group management system in accordance with the present embodiment may include other units besides the units explained in the present embodiment.

Furthermore, in the present embodiment, there has been explained a case where the server 10 transmits the authority information to the client, but it may be possible that the server 10 does not transmit the authority information. In this case, the server 10 may not include the authority information transmitter 17.

Besides, in the present embodiment, there has been explained a case where the server 10 modifies the authority information in response to the modification instruction information, but it may be possible that the server 10 does not modify the authority information in response to the modification instruction information. In this case, the server 10 may not include the modification instruction information receiver 15 and the authority information modifying unit 16. Moreover, in case that these units are not included, the authority information storage 11 may include a detachable storage medium, and by separating the storage medium of the authority information storage 11 from the server 10 and installing it in another device, the authority information can be updated.

Besides, in the present embodiment, the permission/rejection determination may not be made only on an operation of the server 10 or the manufacturing apparatus 40 but also an operation of the other devices such as another server other than the server 10 in case that the group management system includes two or more servers.

Moreover, in the above embodiment, each operation or each function can be implemented by centralized processing in a single device or a single system, or can be implemented by distributed processing in a plurality of devices or systems.

Further, in the above embodiment, each of the components can be implemented by a dedicated hardware, and as for the components executable by software, they can be implemented by executing a program. Each of the components can be implemented by reading and executing a software program stored in a storage medium such as a hard disc, a semiconductor memory, or the like by a program execution unit such as a CPU or the like. Here, the software for implementing the server 10 in the above embodiment is the following program. That is, a program enables a computer to function as a server included in a group management system including: one or more manufacturing apparatuses for performing a predetermined semiconductor process on a target substrate; the server connected with the one or more manufacturing apparatuses; and a client device for requesting an operation of the manufacturing apparatuses or the server, and the program enables the computer to function as: a determination request information receiver for receiving determination request information that is transmitted from the manufacturing apparatus or the client device and requests a permission/rejection determination on execution of a desired operation; a permission/rejection determination unit for making a permission/rejection determination in response to the determination request information received by the determination request information receiver based on the authority information; and a determination result information transmitter for transmitting determination result information on a determination result made by the permission/rejection determination unit to the device that transmitted the determination request information.

Further, as for the program, a function which can be implemented only by hardware is not included in the functions executed by the program. For example, a function which can be implemented only by hardware such as a modem or an interface card in a receiver for receiving information or a transmitter for transmitting information is not included in the functions executed by the program.

In addition, it may be possible to execute the program by downloading it from a server or reading it from a predetermined storage medium (an optical disc such as a CD-ROM, a magnetic disc, a semiconductor memory, or the like).

Further, one or more computers can be used to execute the program. That is, centralized processing or distributed processing can be performed.

The present invention is not limited to the above-mentioned embodiments and can be modified in various ways, and it shall be understood that all the modifications are included in the scope of the present invention.

As stated above, the server or the like in accordance with the present invention is capable of managing the authority information and useful in the group management system including the manufacturing apparatus for performing a semiconductor process on a target substrate.

What is claimed is:

1. A server communicating with a plurality of manufacturing apparatuses, each performing a predetermined semiconductor process on a target substrate, the server comprising:
an authority information storage configured to store therein authority information on an operation authority in a centralized manner for the plurality of manufacturing apparatuses;
a determination request information receiver configured to receive determination request information that is transmitted from one of the plurality of manufacturing apparatuses which is accessed by a user, and requests a permission/rejection determination on execution of a desired operation;
a permission/rejection determination unit configured to make a permission/rejection determination in response to the determination request information received by the determination request information receiver based on the authority information; and
a determination result information transmitter configured to transmit permission result information to the one of the plurality of manufacturing apparatuses allowing the user to execute the desired operation by the one of the plurality of manufacturing apparatuses if the permission/rejection determination made by the permission/rejection determination unit is permission determination, and further configured to transmit rejection result information to the one of the plurality of manufacturing apparatuses preventing the user from executing the desired operation by the one of the plurality of manufacturing apparatuses if the permission/rejection determination made by the permission/rejection determination unit is rejection determination.

2. The server of claim 1, further comprising:
a modification instruction information receiver configured to receive modification instruction information on a modification instruction of the authority information; and
an authority information modifying unit configured to modify the authority information stored in the authority information storage in response to the modification instruction information received by the modification instruction information receiver.

3. The server of claim 1, further comprising:
an authority information transmitter configured to transmit the authority information stored in the authority information storage to the one of the plurality of manufacturing apparatuses.

4. The server of claim 1, wherein the authority information includes correspondence information between user identification information for identifying a user and user authority information on a user's authority for an operation, the determination request information includes the user identification information of the user who requested an operation, and the permission/rejection determination unit makes the permission/rejection determination based on the user authority information corresponding to the user identification information included in the determination request information.

5. The server of claim 4, wherein the authority information includes correspondence information between group identification information for identifying a group including a multiple number of users and group authority information on a group's authority for an operation, and the permission/rejection determination unit makes the permission/rejection determination based on the group authority information corresponding to the group identification information of a group including the user identified by the user identification information included in the determination request information.

6. The server of claim 1, wherein the operation is at least any one of a manipulation operation of the one of the plurality of manufacturing apparatuses or the server.

7. The server of claim 1, wherein if the permission/rejection determination unit makes a permission determination, the determination result information includes key information on a key enabling the operation execution.

8. The server of claim 1, wherein the operation is at least any one of an access operation to a recipe used in the one of the plurality of manufacturing apparatuses, an access operation to a parameter used in the one of the plurality of manufacturing apparatuses, and a recovery operation of the one of the plurality of manufacturing apparatuses.

9. The server of claim 8, wherein the operation is at least any one of an access operation to collection data collected in the one of the plurality of manufacturing apparatuses and stored in the one of the plurality of manufacturing apparatuses or the server, and an access operation to data statistically processed from the collection data.

10. An information processing method used in a server communicating with a plurality of manufacturing apparatuses, each performing a predetermined semiconductor process on a target substrate, the method comprising:

receiving determination request information that is transmitted from one of the plurality of manufacturing apparatuses which is accessed by a user, and requests a permission/rejection determination on execution of a desired operation;

making a permission/rejection determination in response to the determination request information received in a process of receiving the determination request information based on authority information on an operation authority stored in a centralized manner for the plurality of manufacturing apparatuses; and transmitting permission result information to the one of the plurality of manufacturing apparatuses allowing the user to execute the desired operation by the one of the plurality of manufacturing apparatuses if the permission/rejection determination made in a process of making the permission/rejection determination is permission determination, and transmitting rejection result information to the one of the plurality of manufacturing apparatuses preventing the user from executing the desired operation by the one of the plurality of manufacturing apparatuses if the permission/rejection determination made in the process of making the permission/rejection determination is rejection determination.

11. The method of claim 10, wherein the authority information is transmitted to the one of the plurality of manufacturing apparatuses.

12. The server of claim 11, wherein the authority information includes correspondence information between group identification information for identifying a group including a multiple number of users and group authority information on a group's authority for an operation, and the permission/rejection determination is made based on the group authority information corresponding to the group identification information of a group including the user identified by the user identification information included in the determination request information.

13. The method of claim 10, wherein the authority information includes correspondence information between user identification information for identifying a user and user authority information on a user's authority for an operation, the determination request information includes the user identification information of the user who requested an operation, and the permission/rejection determination is made based on the user authority information corresponding to the user identification information included in the determination request information.

14. The method of claim 10, wherein the operation is at least any one of a manipulation operation of the one of the plurality of manufacturing apparatuses or the server.

15. The method of claim 10, the determination result information includes key information on a key enabling the operation execution.

16. The method of claim 10, wherein the operation is at least any one of an access operation to a recipe used in the one of the plurality of manufacturing apparatuses, an access operation to a parameter used in the one of the plurality of manufacturing apparatuses, and a recovery operation of the one of the plurality of manufacturing apparatuses.

17. The server of claim 16, wherein the operation is at least any one of an access operation to collection data collected in the one of the plurality of manufacturing apparatuses and stored in the one of the plurality of manufacturing apparatuses or the server, and an access operation to data statistically processed from the collection data.

18. A non-transitory storage medium storing therein a program configured to perform the method of claim 10.

* * * * *